(12) United States Patent
Nihei et al.

(10) Patent No.: US 7,703,349 B2
(45) Date of Patent: Apr. 27, 2010

(54) CABLE LAYING STRUCTURE FOR ROBOT

(75) Inventors: Ryo Nihei, Fujiyoshida (JP); Toshihiko Inoue, Yamanashi (JP); Jun Ibayashi, Yamanashi (JP); Takatoshi Iwayama, Yamanashi (JP)

(73) Assignee: Fanuc Ltd, Yamanashi (JP)

( * ) Notice: Subject to any disclaimer, the term of this patent is extended or adjusted under 35 U.S.C. 154(b) by 1824 days.

(21) Appl. No.: 10/653,969

(22) Filed: Sep. 4, 2003

(65) Prior Publication Data

US 2004/0052630 A1 Mar. 18, 2004

(30) Foreign Application Priority Data

Sep. 4, 2002 (JP) ............... 2002-259201

(51) Int. Cl.
*B25J 19/06* (2006.01)
*H05K 9/00* (2006.01)

(52) U.S. Cl. ............ 74/490.02; 174/350; 901/46; 901/47

(58) Field of Classification Search ............... 600/102, 600/134; 901/46, 47; 174/350; 74/490.02
See application file for complete search history.

(56) References Cited

U.S. PATENT DOCUMENTS

| 4,460,826 | A | * | 7/1984 | Pryor ............... 250/227.2 |
| 4,616,121 | A | * | 10/1986 | Clocksin et al. ....... 219/124.34 |
| 4,621,332 | A | | 11/1986 | Sugimoto et al. |
| 4,879,992 | A | * | 11/1989 | Nishigaki et al. ......... 600/110 |
| 4,931,617 | A | * | 6/1990 | Toyoda et al. ........... 219/125.1 |
| 5,132,601 | A | * | 7/1992 | Ohtani .................. 318/568.1 |
| 5,375,480 | A | * | 12/1994 | Nihei et al. ............. 74/490.02 |
| 5,986,423 | A | * | 11/1999 | Matsumoto et al. ..... 318/568.16 |
| 6,346,072 | B1 | * | 2/2002 | Cooper ................... 600/102 |
| 6,390,972 | B1 | * | 5/2002 | Speier et al. ............. 600/112 |
| 6,398,721 | B1 | * | 6/2002 | Nakamura et al. ........ 600/102 |
| 6,569,084 | B1 | * | 5/2003 | Mizuno et al. ........... 600/102 |

FOREIGN PATENT DOCUMENTS

EP 0 323 515 A1 7/1989

(Continued)

OTHER PUBLICATIONS

Notice of Grounds for Rejection, Japanese Patent Office, dated Aug. 24, 2004.

*Primary Examiner*—John P Leubecker
(74) *Attorney, Agent, or Firm*—Staas & Halsey LLP

(57) ABSTRACT

A cable laying structure for a robot, which does not interfere with external devices in a periphery of a forearm. Camera and hand control cables and motor control cables are drawn into a robot mechanism through a connection panel of a base of a robot main body. While allowing the motor control cables to sequentially diverge, the control cables are arranged in a robot arm along an upper arm portion and guided to the forearm. The control cables are introduced into the forearm with a shield and a sheath removed. After reaching an end effector-mounting face, the control cables are connected to a camera and a hand. The forearm is formed of conductive material and grounded on the base of the robot main body to have the same electric potential as the base by using an earth cable, and therefore the forearm is utilized in replacement of the shield.

9 Claims, 6 Drawing Sheets

FOREIGN PATENT DOCUMENTS

| | | |
|---|---|---|
| JP | 2-139083 | 11/1990 |
| JP | 04-105888 | 4/1992 |
| JP | 5-92378 | 4/1993 |
| JP | 5-96484 | 4/1993 |
| JP | 10-026119 | 1/1998 |
| JP | 11-118090 | 4/1999 |
| JP | 2001-145634 | 5/2001 |

* cited by examiner

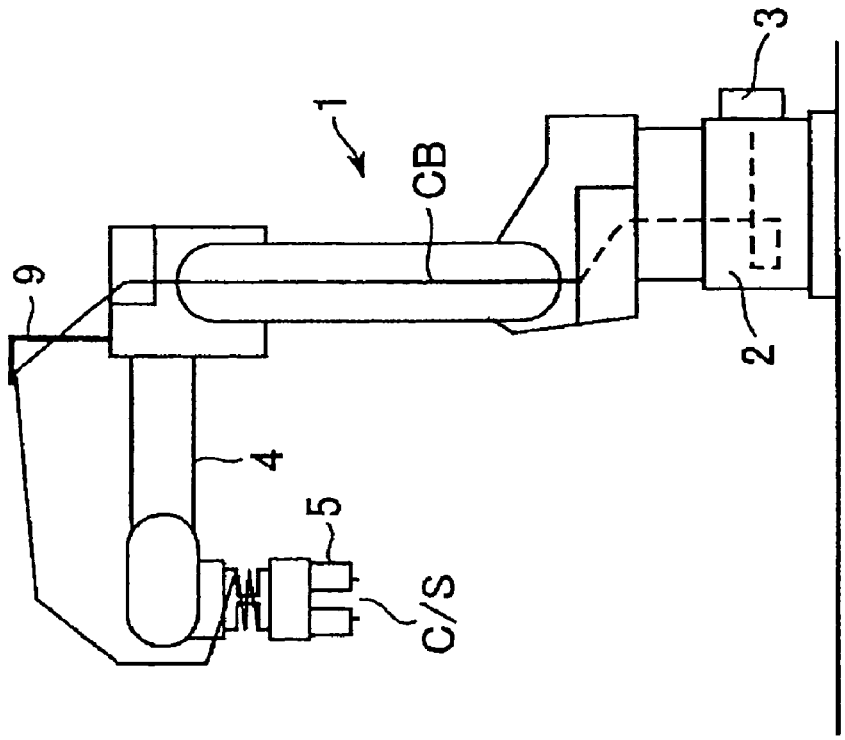
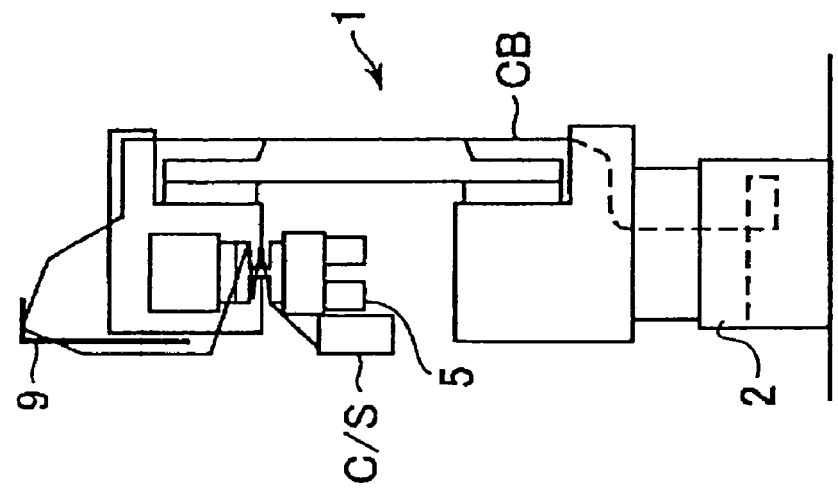

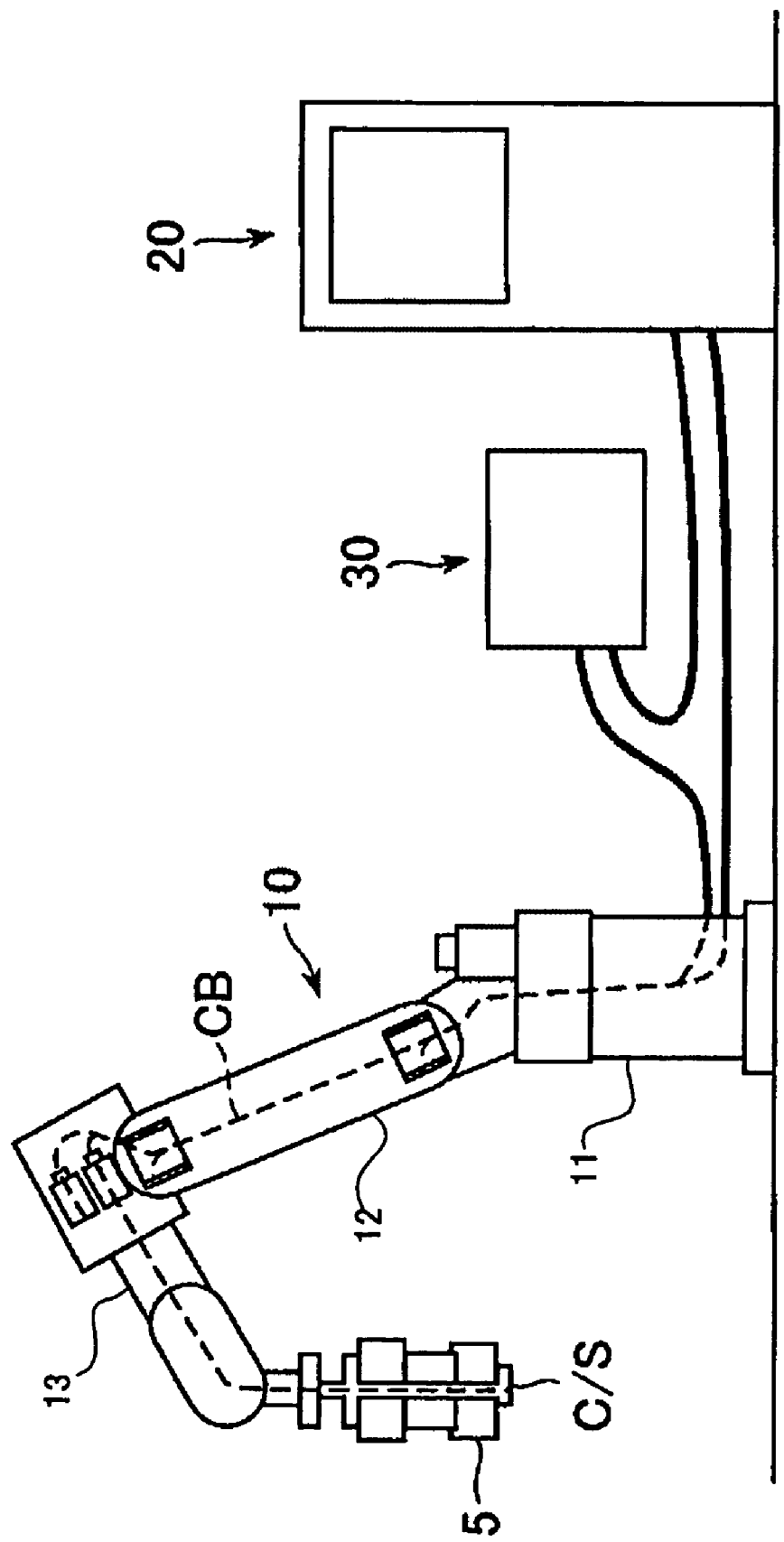

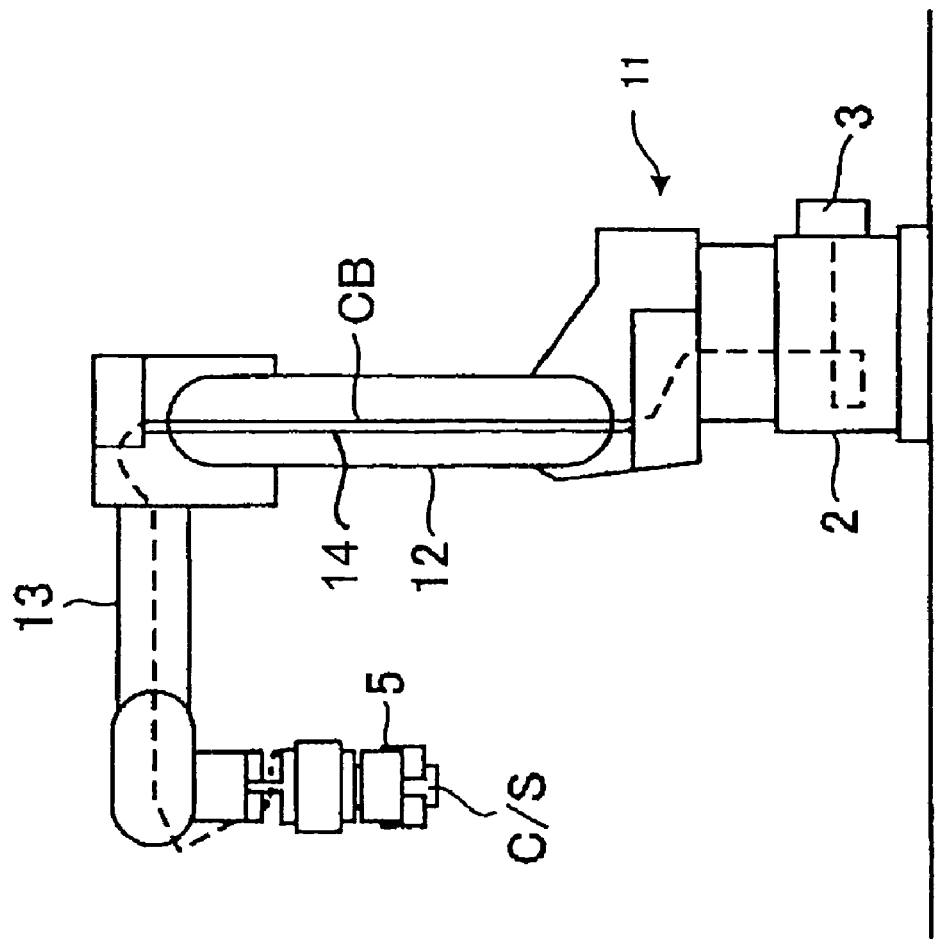
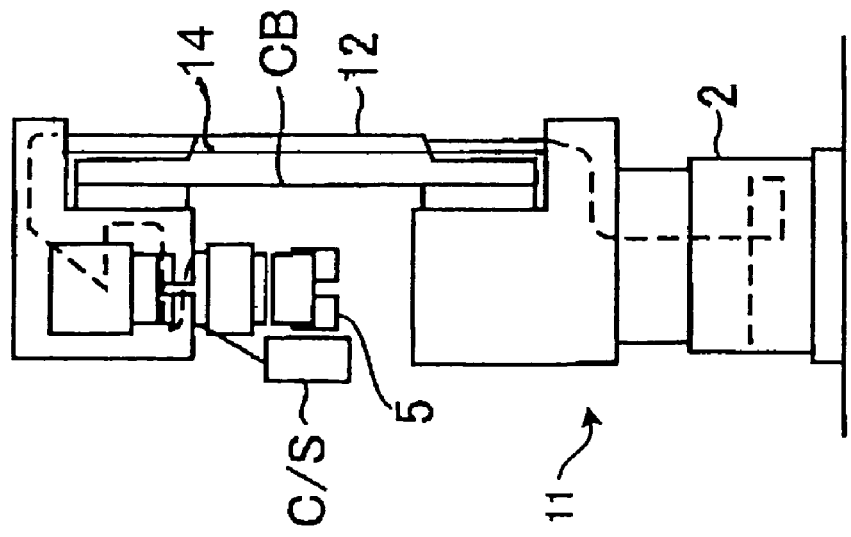

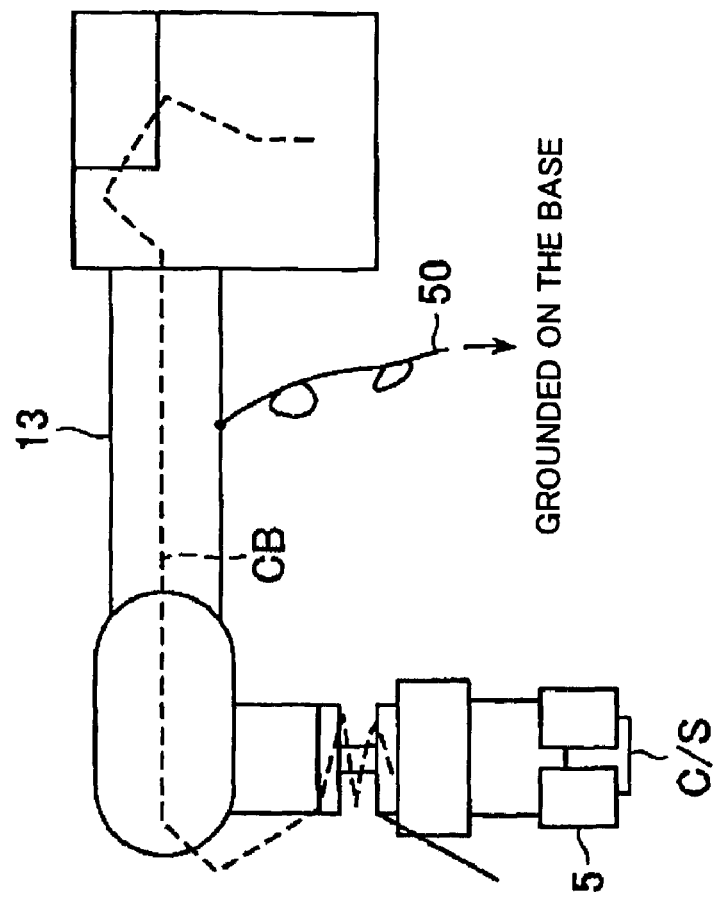
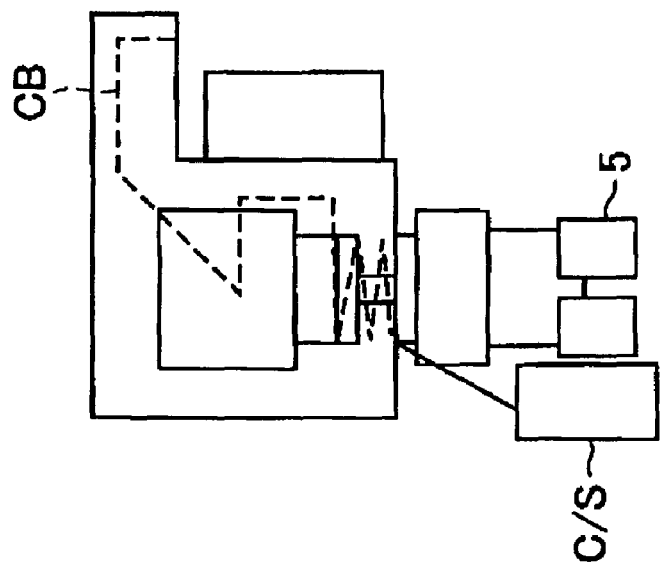

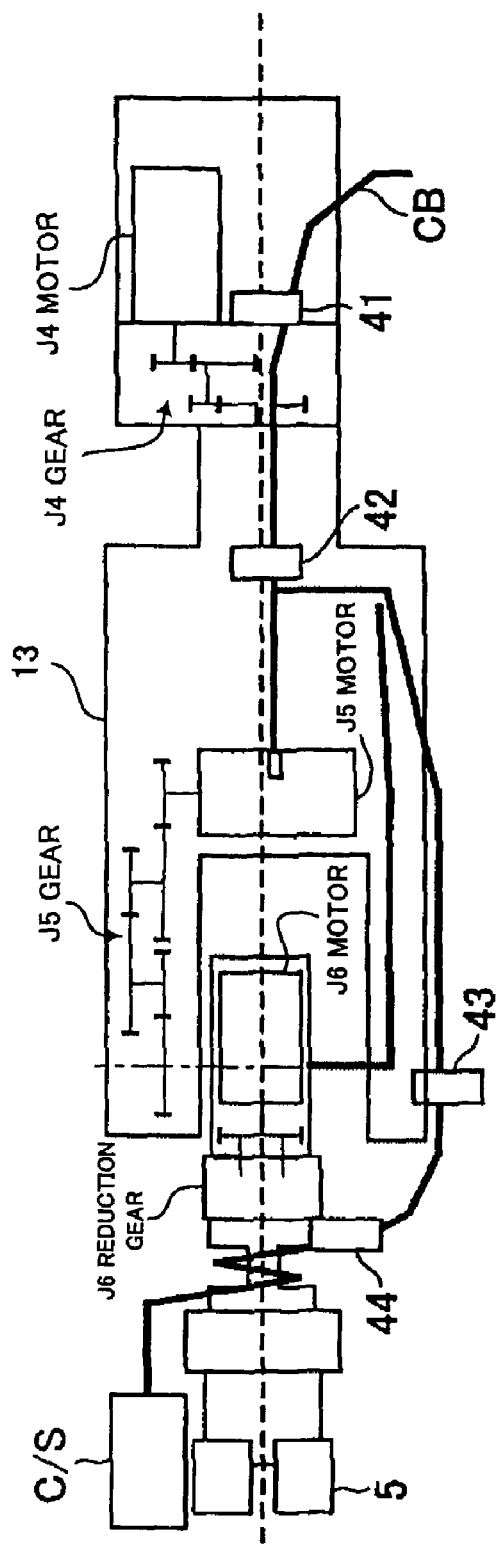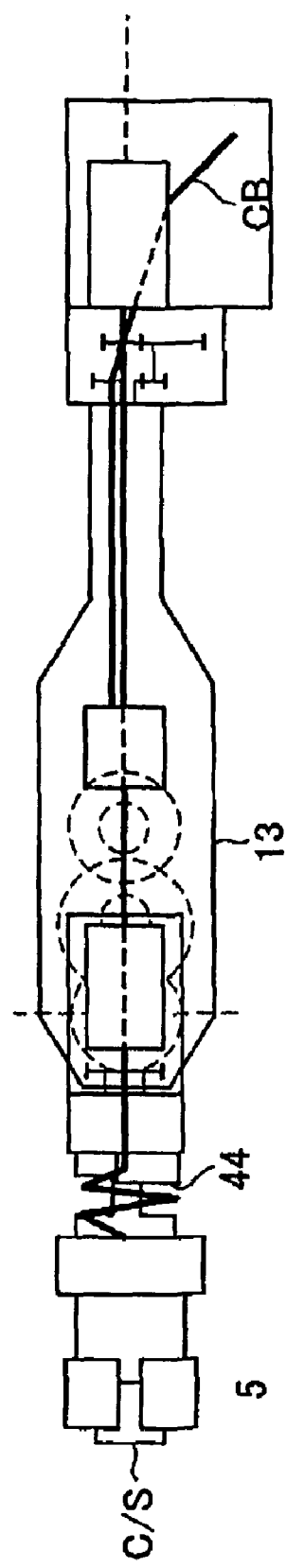
FIG.5a
FIG.5b

CABLE LAYING STRUCTURE FOR ROBOT

BACKGROUND OF THE INVENTION

1. Field of the Invention

The present invention relates to a cable laying structure for an industrial robot and in particular to a cable laying structure for connection with an analogue camera, a digital camera or a force sensor, which is attached to a wrist of an industrial robot of a horizontal or vertical articulated type.

2. Description of Related Art

In recent years, it has been more and more common to equip a robot with a visual or force sensor in order to make the robot intelligent. In case that the robot is equipped with a visual or force sensor, it is required to attach camera cables for controlling a visual sensor or force-sensor cables for controlling a force sensor to the robot. For instance, JP 2001-145634A discloses a cable laying structure for an endoscope (camera) attached to a robot.

A camera utilized for a visual sensor is generally an analogue or digital camera. Analogue camera cables include a coaxial cable for transmitting a signal and a camera power cable, whereas digital camera cables include a signal cable for transmitting a digital picture signal and a camera power cable. On the other hand, utilized for the force-sensor cables are a signal cable for transmitting a detection signal of a strain gauge in a force sensor and a force-sensor power cable.

A cable structure usually employed is the one in which the whole cables are covered with a shield member and a sheath so that the picture signal of the camera and the detection signal of strain gauge of the force sensor are not affected by noise from without and so that noise does not leak outside. Therefore, the sheath and shield of the camera and force-sensor cables are indispensable. Consequently, as for a robot with a forearm portion having a wrist shaft movable in a wide range, the cables are managed while being supported by an external supporting member in consideration of the life of the cables as in the mode in which the cables are hung outside the forearm by a hanger.

FIGS. 1a and 1b illustrate the above arrangement. In the vicinity of the wrist of the robot 1, there is mounted an analogue camera, or digital camera, or force sensor C/S alongside of the hand 5. The cables CB connected to the camera or force sensor C/S are introduced into the inside of robot mechanism from the connection panel 3 with a connector, that is fixed to a base 2 of a robot 1, and drawn out of the robot mechanism in the immediate vicinity of the forearm 4. The cables CB that have been drawn out of the robot main body are hung by the hanger 9 mounted closely to the forearm 4 and pass the outside of the forearm 4 to reach the camera or force sensor C/S.

In a conventional cable laying structure, as described above, the camera cables that control the visual sensor (analogue or digital camera) mounted closely to the tip end of the robot wrist or the force-sensor cables that control the force sensor are embedded in the robot arm up to the immediate vicinity of the forearm. From the forearm portion to the tip end of the wrist, however, the cables are hung by the hanger or the like, that is attached on the outside of the robot arm, to be managed as far as the tip end of the robot wrist.

For this reason, when the robot system is actually utilized, the cables are liable to interfere with peripheral devices, which often becomes a problem in the field.

SUMMARY OF THE INVENTION

The present invention provides a cable laying structure for a robot capable of preventing an interference with external devices in a periphery of a forearm of a robot.

According to the present invention, cables for an analogue or digital camera or a force sensor attached to a wrist of a horizontal or vertical articulated robot are arranged inside a body and an upper arm to a proximal portion of a forearm, and further the cables are led into the forearm from the proximal portion. The forearm is grounded to have the same electric potential as a base member of the robot to thereby electrically shielding the cables. Thus, the cables in the forearm are allowed to have a section where a shield and a sheath are removed to have a required degree of freedom of deformation. Accordingly, the cables passing through the forearm does not impede the motion of the forearm, and the motion of the forearm does not damage the cables.

In other words, in a section of the camera or force-sensor cables arranged in the forearm, the shield and the sheath of the cables are removed to increase the degree of freedom of deformation, thereby preventing lives of the cables from being shortened by bending or twisting deformation of the cables through rotary motion of the forearm.

It may be considered that picture signals or detection signals being transmitted are prone to be affected by noises from outside and noises are liable to leak outside if the shield member covering the camera or force-sensor cables is removed. These fears can be eliminated by grounding the robot forearm by making the forearm have the same electric potential as the base member of the robot.

Making the forearm have the same potential as the base member can be easily realized without employing a complicated structure since the forearm and the base member are both generally formed of a conductive material. The forearm is connected to the base member through a plurality of joints and links, so that the forearm can be made to have the same potential as the base member simply by electrically connecting the links by earth cables. Alternatively, the forearm and the base member may be directly connected to each other by earth cables or the like.

Thus, the forearm can serve as a substitute for the shield member of the cable by grounding the robot forearm on the base member of the robot to make countermeasures against noise.

BRIEF DESCRIPTION OF THE DRAWINGS

FIGS. 1a and 1b are an elevation view and a side view, respectively, showing a laying structure of camera or force-sensor cables in prior art;

FIG. 2 is a view showing the whole structure of a robot system including a robot in which the camera cables (or force-sensor cables) are embedded in a forearm according to the present invention;

FIGS. 3a and 3b are an elevation view and a right side view, respectively, showing a skeletal form of cable routing that is employed in an embodiment of the present invention;

FIGS. 4a and 4b are an enlarged elevation view and an enlarged right side view, respectively, showing cable management in the forearm portion in respect of the cable routing shown in FIGS. 3a and 3b;

FIGS. 5a and 5b are a top view and a side view showing the cable routing shown in FIGS. 3a and 3b, respectively; and FIG. 6a is a sectional view showing a state where a shield of the camera cables used in the present invention is in a sheath, whereas

DETAILED DESCRIPTION

Figure 6A:
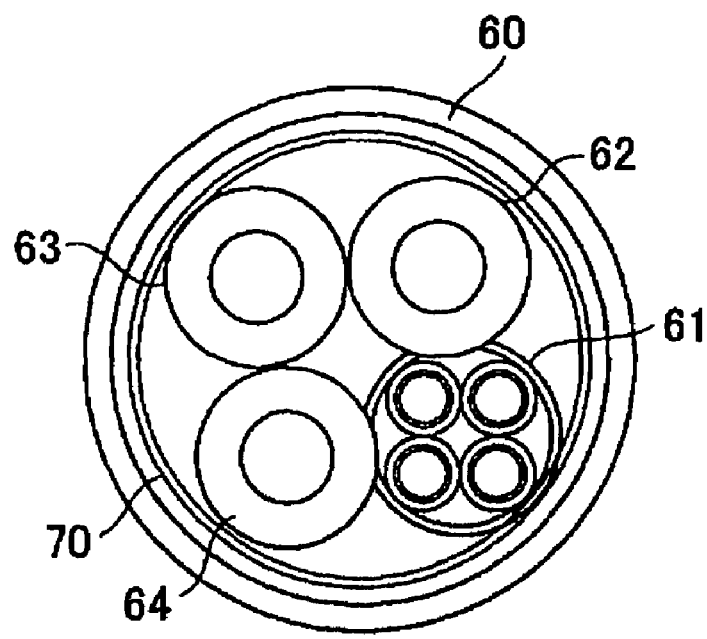

An embodiment will be described below with a focus on a case in which a camera (analogue or digital camera) is fixed in the vicinity of a robot wrist, and cables utilized are camera cables. It is possible, however, to replace the camera with a force sensor, and the camera cables with force-sensor cables. Accordingly, there will be additional notes in parentheses as to a case in which a force sensor is fixed near the robot wrist, and the cables utilized are force-sensor cables.

FIG. 2 is a view showing the whole structure of a robot system including a robot in which camera cables (or force-sensor cables) are embedded in a forearm according to the present invention. As shown in FIG. 2, a visual sensor camera (or force sensor) C/S and a hand 5 are attached at a tip end of the robot wrist. The camera (or force sensor) C/S and the hand 5 are connected to an end effector controller 30 by cables CB.

In case that the camera is utilized, an image processor for constructing the visual sensor with the camera is included in the end effector controller 30. On the other hand, if a force sensor is utilized, the end effector controller 30 includes a device for converting an output of a strain gauge into, for example, six axial forces, and the like.

Drive control of a motor of each axis in a robot mechanism 10 takes place in a robot controller 20. In FIG. 2, a cable for drive control is illustrated together as cables CB in the lump. In some cases, the end effector controller 30 is incorporated into the robot controller 20. As for an industrial robot, it would be desirable to construct the cables integrally with a robot arm in order to avoid interference with devices on the periphery of the robot.

With reference to FIGS. 3a through 5b, a cable arrangement structure according to the embodiment will be explained. FIGS. 3a and 3b are an elevation view and a right side view showing a skeletal form of cable routing that is employed in the embodiment, respectively. FIGS. 4a and 4b are enlarged views showing cable management in the forearm portion in respect of the cable routing shown in FIGS. 3a and 3b, respectively. FIGS. 5a and 5b are a top view and a side view rather specifically showing the cable routing shown in FIGS. 3a and 3b, respectively.

With reference to these drawings, camera (analogue or digital camera) and hand control cables and servo motor control cables are drawn into the robot mechanism 10 from the controller (the robot controller 20 or the end effector controller 30 illustrated in FIG. 2) through a connection panel 3 with a connector in the rear of a base 2 of a robot main body.

In cases where a force sensor is mounted on the robot in replacement of the camera, force-sensor and hand control cables are drawn into the robot mechanism 10 from the controller (robot controller 20 or the end effector controller 30 illustrated in FIG. 2) through the connection panel 3 with a connector, that is situated in the rear of the base 2 of the robot main body. FIG. 3 shows these control cables with a reference character CB (in a dashed and a solid line) in the lump. Moreover, the "control cables" include a transmission wire of input/output signals, a power supply wire, an air supply pipe, and the like, that are required for the camera (or force sensor), hand, and motor, respectively.

The control cables CB drawn into the robot mechanism 10 are introduced into a hollow portion situated at the center of a revolving trunk 11. Cables that diverge from the servo motor control cables are connected to a first and a second axis driving motor (details not shown).

The rest of the control cables are embedded in the robot arm along an upper arm portion 12 and guided to a forearm 13.

The cables that have been guided to the forearm 13 are illustrated in enlarged views, namely FIGS. 4a and 4b showing cable management and FIGS. 5a and 5b showing a little more details. As for the control cables CB that have been guided to the forearm 13, the cables that have diverged from the servo motor control cables are connected to a third axis driving motor (J3 motor) and a fourth axis driving motor (J4 motor) with respective gears. The rest of the cables are introduced into the inside of the forearm. A reference numeral 41 represents a clamp member disposed in the vicinity of the forearm portion, and the control cables for the J3 and J4 motors diverge therefrom.

The camera cables (or force-sensor cables) that have been introduced into the inside of the forearm are subjected to bending and twisting near a rotation axis of the forearm when the forearm rotates (generally ±180° or more). Accordingly, in order to secure the life of the cables, the cables are introduced in the forearm 13 with a shield member and a sheath removed and fixed in front and rear portions of the forearm 13 by clamp members 42, 43 or the like. FIG. 5a shows one of the clamp members with reference numeral 42.

Figure 6B:
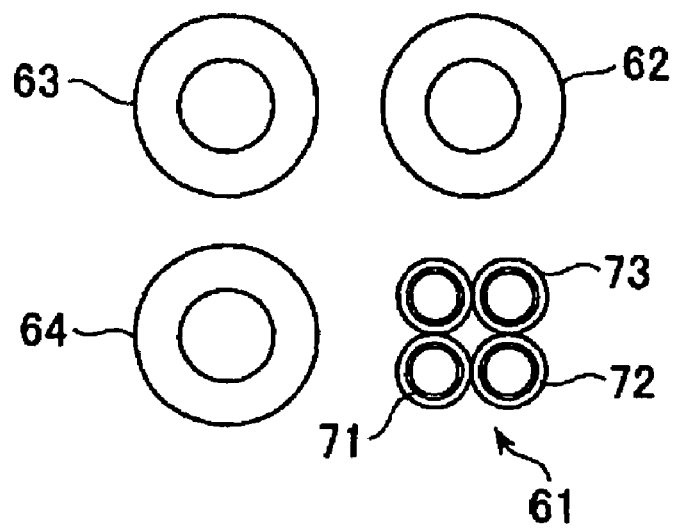
FIG. 6b is a sectional view showing a state where the shield and the sheath are removed in the forearm portion of the robot.

FIGS. 6a and 6b are sectional views showing for contrast a state where the camera cables as an example are in the shield and the sheath and a state where the wiring is arranged in the forearm 13 with the shield and the sheath removed, respectively. As illustrated in FIGS. 6a and 6b, the camera cables herein are those for an analogue camera and include coaxial cables 61, 62 and 63 and a signal cable 64 that are covered with a sheath 60 and a shield member 70. The coaxial cables 61, 62 and 63 and the signal cable 64 each accommodate a power cable 71, signal cables (control signal transmission cable 72 and analogue picture signal transmission cable 73) and the like in an allotted manner.

In case that the camera utilized is a digital camera, a signal cable for transmitting a digital picture signal is used to transmit the digital picture signal. If the force sensor is utilized, force-sensor cables are used, the force-sensor cables including a signal cable for transmitting a detection signal of a strain gauge in the force sensor and a force-sensor power cable. In either case, as contrastively shown in FIGS. 6a and 6b, the cable laying takes place with the shield member and the sheath surrounding these cables removed at least in a certain cable-passing section in the forearm 13.

As illustrated in FIG. 6b, in the forearm 13, when not only the sheath but the shield is removed, signals are liable to be affected by noise from without, and noise is prone to leak outside. However, countermeasures against noise are realized since the base 2 of the robot main body and a proper position of the forearm 13 formed of a conductive material are grounded at the same potential to utilize the forearm 13 in replacement of the shield member. Furthermore, the base 2 of the robot main body ought to be provided with a ground from the beginning. Under favour of this ground, the forearm 13 serves as a grounded shield if a proper position of the forearm 13 is connected to the base 2 of the robot main body.

Since the forearm 13 is connected to the base 2 of the robot main body with the joints therebetween, the forearm 13 can be grounded, for example, by electrically connecting the links constructing the connecting link structure between the base 2 of the robot main body and the forearm 13 by means of the earth cable, 14.

Moreover, the earth cable 14 whose end is grounded on the base 2 of the main body may be introduced into the inside of the forearm 13 together with the control cables and connected to the conductive member constructing the forearm 13 in the forearm 13. In addition, the forearm 13 and the base 2 of the robot main body may be directly connected to each other by means of an earth cable 50 to be grounded at the same potential.

Herein, the camera control cables have upstream and downstream sections from the forearm 13 that are each covered with the shield member and the sheath, and it is possible to ground the shield member on the robot arm to reinforce the shield in an end portion. In this case, fixing loosen cables directly by a clamp member may cause the cables to be bent. Therefore, the camera cables are occasionally fixed after being bundled with the other control cables.

The control cables CB that have been led to the inside of the forearm 13 are guided to the end effector-mounting face 44 in a state where the servo motor control cables are connected to a fifth axis driving motor (J5 motor) and a sixth axis driving motor (J6 motor) with respective gears, and the camera (or force sensor) control cables and hand control cables are drawn outside the forearm from one side face of a front portion of the forearm and wired along the side face of the forearm so as to have an extra length.

As described above, since the control cables CB are subjected to bending when the wrist swings, the cables need to have a sufficient extra length around the wrist. It is often the case, however, that the robot equipped with a camera operates in the downward direction below a horizontal level, and an operating range of the wrist swing can be limited to approximately 130°. Accordingly, the sheath and the shield are not necessarily required to be removed from this part of the camera cables, and the camera cables can be managed along the forearm with the sheath and the shield attached.

The control cables that have been guided to the end effector-mounting face are housed in a circled state under favour of sufficiently wide space prepared for mounting the camera (or force sensor) C/S and the hand 5 offset, and eventually connected to the end effector including the camera (or force sensor).

The robot equipped with a camera is generally required to do detection in an upper portion of work from various angles, thereby demanding an operating range of ±180° or more. On the contrary, if the space for mounting the visual sensor and the hand on the end effector-mounting face offset is effectively used, it is possible to compactly organize the periphery of the end effector without preparing space exclusive for the cable arrangement.

The above-mentioned structure makes it possible to complete the management of the camera cables and to pack the whole cables in the robot arm without making a projection over the periphery, thereby eliminating the problem of interference with peripheral devices in the subject area. Similarly, the force sensor cables could be embedded in the forearm 13 in the same manner as the above-described structure.

According to the present invention, it is possible to improve the cable laying structure for connection with a camera or a sensor attached to a wrist of a robot, so that camera or force-sensor cables are arranged inside a forearm of the robot, thereby preventing an interference with peripheral devices in the periphery of the forearm. By providing the robot forearm with a shielding function, picture signals and sensor signals in transmission through the cables are prevented from being affected by noises from outside, and also leakage of noises from the cables are prevented.

What is claimed is:

1. A cable laying structure for connection with an analogue camera attached to a wrist of an articulated robot having a base member, a forearm and the wrist, said cable laying structure comprising:

camera cables including a coaxial cable for transmitting analogue picture signals from the analogue camera and a camera power cable, a part of said camera cables being arranged inside the forearm, the part of said camera cables being arranged inside the forearm having a shield and a sheath removed, said camera cables being fixed in front and rear portions of the forearm by clamp members; and grounding means for making the forearm have the same electric potential as the base member so that the forearm is grounded, thereby electrically shielding said camera cables by the forearm.

2. A cable laying structure according to claim 1, wherein said grounding means comprises earth cables electrically connecting links of the articulated robot from the base member to the forearm.

3. A cable laying structure according to claim 1, wherein said camera cables are led into the forearm in the vicinity of a rotational axis of the forearm at a proximal portion thereof and led outside from a side face of the forearm at a distal portion thereof.

4. A cable laying structure for connection with a digital camera attached to a wrist of an articulated robot having a base member, a forearm and the wrist, said cable laying structure comprising:

camera cables include a signal cable for transmitting digital picture signals from the digital camera and a camera power cable, a part of said camera cables being arranged inside the forearm, the part of said camera cables being arranged inside the forearm having a shield and a sheath removed, said camera cables being fixed in front and rear portions of the forearm by clamp members; and grounding means for making the forearm have the same electric potential as the base member so that the forearm is grounded, thereby electrically shielding said camera cables by the forearm.

5. A cable laying structure according to claim 4, wherein said grounding means comprises earth cables electrically connecting links of the articulated robot from the base member to the forearm.

6. A cable laying structure according to claim 4, wherein said camera cables are led into the forearm in the vicinity of a rotational axis of the forearm at a proximal portion thereof and led outside from a side face of the forearm at a distal portion thereof.

7. A cable laying structure for connection with a force sensor attached to a wrist of an articulated robot having a base member, a forearm and the wrist, said cable laying structure comprising:

force-sensor cables include a signal cable for transmitting detection signals of a strain gauge in the force sensor and a force-sensor power cable, a part of said force-sensor cable being arranged inside the forearm, the part of said force-sensor cable being arranged inside the forearm having a shield and a sheath removed, said force-sensor cables being fixed in front and rear portions of the forearm by clamp members; and grounding means for making the forearm have the same electric potential as the base member so that the forearm is grounded, thereby electrically shielding said force-sensor cables by the forearm.

8. A cable laying structure according to claim 7, wherein said grounding means comprises earth cables electrically connecting links of the articulated robot from the base member to the forearm.

9. A cable laying structure according to claim 7, wherein said force-sensor cables are led into the forearm in the vicinity of a rotational axis of the forearm at a proximal portion thereof and led outside from a side face of the forearm at a distal portion thereof.

* * * * *